(12) United States Patent
Lin

(10) Patent No.: US 7,551,033 B2
(45) Date of Patent: Jun. 23, 2009

(54) DYNAMIC BANDWIDTH COMPENSATING METHOD AND ASSOCIATED APPARATUS

(75) Inventor: Heng-Chih Lin, Hsinchu (TW)

(73) Assignee: Mstar Semiconductor, Inc., Hsinchu (TW)

( * ) Notice: Subject to any disclaimer, the term of this patent is extended or adjusted under 35 U.S.C. 154(b) by 35 days.

(21) Appl. No.: 11/968,296

(22) Filed: Jan. 2, 2008

(65) Prior Publication Data

US 2008/0157874 A1 Jul. 3, 2008

Related U.S. Application Data

(60) Provisional application No. 60/883,156, filed on Jan. 2, 2007.

(51) Int. Cl.
*H03F 1/14* (2006.01)
(52) U.S. Cl. .................. 330/292; 330/253; 330/254
(58) Field of Classification Search .................. 330/292, 330/253, 254
See application file for complete search history.

(56) References Cited

U.S. PATENT DOCUMENTS 5,635,871 A * 6/1997 Cavigelli ............. 330/107
6,002,299 A * 12/1999 Thomsen ............. 330/9
6,020,785 A * 2/2000 Allen et al. ............ 330/2
6,148,048 A * 11/2000 Kerth et al. ............ 375/350
7,154,331 B2 * 12/2006 Zaguri ................ 330/254
7,324,615 B2 * 1/2008 Lourens et al. ........ 375/343

* cited by examiner

*Primary Examiner*—Patricia Nguyen
(74) *Attorney, Agent, or Firm*—Kirton & McConkie; Evan R. Witt

(57) ABSTRACT

A programmable gain amplifier includes an operational amplifier coupled thereto a plurality of resistors to perform a feedback control, thereby rendering a closed-loop gain $$A_f(s) = \frac{A(s)}{1 + A(s) \cdot \beta},$$

where $\beta$ is a feedback factor determined by the resistance of the resistors and $A(s)$ is an open-loop gain of the operational amplifier. The operational amplifier includes a first-stage amplifying circuit, a second-stage amplifying circuit, and a compensating capacitor coupled to an output end of the first-stage amplifying circuit and having an equivalent capacitance variable to adjust a dominant-pole frequency of the open-loop gain of the operational amplifier.

19 Claims, 9 Drawing Sheets

DYNAMIC BANDWIDTH COMPENSATING METHOD AND ASSOCIATED APPARATUS

CROSS REFERENCE TO RELATED PATENT APPLICATION

This patent application claims the benefit of U.S. provisional patent application No. 60/883,156, filed Jan. 2, 2007.

FIELD OF THE INVENTION

The present invention relates to a bandwidth compensating method, and more particularly to a dynamic bandwidth compensating method for use in an associated apparatus such as a programmable gain amplifier (PGA).

BACKGROUND OF THE INVENTION

Please refer to FIG. 1 which is a circuit diagram showing a conventional programmable gain amplifier. The programmable gain amplifier includes an operational amplifier (OP) 20, a feedback resistor Rf and a resistor Rs. An input voltage signal Vs is inputted into the operational amplifier 20 from the negative terminal via the resistor Rs. The positive input terminal of the operational amplifier 20 is grounded. On the other hand, the output terminal Vo of the operational amplifier 20 is connected to its own negative input terminal via the feedback resistor Rf. The programmable gain amplifier of FIG. 1 is a Shunt-Shunt feedback amplifier with a feedback factor β. Assuming the open-loop gain of the operational amplifier is A(s), then its loop gain of the programmable gain amplifier is A(s)·β, and the closed-loop gain of the programmable gain amplifier is $$A_f(s) = \frac{A(s)}{1 + A(s) \cdot \beta}.$$

Another conventional programmable gain amplifier is shown in FIG. 2 which is a differential programmable gain amplifier. Compared to the programmable gain amplifier of FIG. 1, the differential programmable gain amplifier of FIG. 2 has a higher common-mode rejection ratio (CMRR) and thus better immunity to common-mode noise. The differential programmable gain amplifier includes a differential operational amplifier 40, two resistors Rs with equal resistance, and two feedback resistors Rf with equal resistance. An input voltage signal Vs is sent to the positive input terminal of the differential operational amplifier 40 via one of the resistors Rs, and also sent to the negative input terminal of the differential operational amplifier 40 via the other resistor Rs. The negative output terminal of the differential operational amplifier 40 is connected to its own positive input terminal via one of the feedback resistors Rf, while the positive output terminal of the differential operational amplifier 40 is connected to its own negative input terminal via the other feedback resistor Rf. An output signal Vo is generated between the positive output terminal and the negative output terminal of the differential operational amplifier 40. Assuming the open-loop gain of the operational amplifier is A(s), like the amplifier of FIG. 1, the loop gain of the operational amplifier of the programmable gain amplifier is A(s)·β, and the closed-loop gain of the programmable gain amplifier is $$A_f(s) = \frac{A(s)}{1 + A(s) \cdot \beta}.$$

Accordingly, by varying the feedback factor β, the gain of the programmable gain amplifier can be dynamically adjusted. Generally, the feedback factor β varies by adjusting the resistance of the resistor Rf.

Please refer to FIG. 3 which is a Bode plot showing the relationship between the open-loop gain A(s) and the closed loop-gain G1, G2 of an operational amplifier. Assuming the equation $$A(s) = \frac{A_0}{\left(1 + \frac{s}{\omega_1}\right)\left(1 + \frac{s}{\omega_2}\right)\left(1 + \frac{s}{\omega_3}\right)}$$

applies, where $A_o$ is a constant, $\omega_3, \omega_2, \omega_1$ are pole frequencies with $\omega_3 > \omega_2 > \omega_1$, the phase $\phi$ is expressed by $\phi = -[\tan^{-1}(\omega/\omega_1) + \tan^{-1}(\omega/\omega_2) + \tan^{-1}(\omega/\omega_3)]$.

It is understood from the Bode plot of FIG. 3 that the open-loop gain A(s) is a horizontal line with a constant gain G0 at frequencies smaller than the frequency $\omega_1$. Then the gain decays with the increase of frequency. The open-loop gain A(s) becomes slantingly linear with a slop of −20 dB/decade between the frequency $\omega_1$ and the frequency $\omega_2$. Afterwards, the slope becomes −40 dB/decade with frequency increasing up to the frequency $\omega_3$ and further becomes −60 dB/decade with frequency higher than the frequency $\omega_3$. Since $\omega_1$ is a cut-off frequency, the bandwidth of the open-loop gain A(s) is equal to $\omega_1$.

When the feedback factor β is equal to $\beta_1$, the Bode plot shows a closed loop gain G1 with a cut-off frequency $\omega_x$, and then decays with a slope of −20 dB/decade. Since the $\omega_x$ is the cut-off frequency, the bandwidth closed loop gain G1 is equal to $\omega_x$. When the feedback factor β is equal to $\beta_2$, the Bode plot shows a closed loop gain G2 with a cut-off frequency $\omega_y$, and then decays with a slope of −20 dB/decade. Since the $\omega_y$ is a cut-off frequency, the bandwidth of the closed loop gain G2 is equal to $\omega_y$.

It is also understood from FIG. 3 that, in the conventional programmable gain amplifier, the gain can be adjusted by way of varying the feedback factor β, while the bandwidth of the programmable gain amplifier is also changed accordingly. In other words, as the gain of the programmable gain amplifier increases, the bandwidth of the programmable gain amplifier is reduced. As the gain of the programmable gain amplifier is reduced, the bandwidth of the programmable gain amplifier is increased. For some applications, such as a video tuner or communication applications, the bandwidth of a programmable gain amplifier is desired to be stable under a variety of gains so as to avoid undesirable serious signal deterioration of some channels with gain changes.

SUMMARY OF THE INVENTION

Therefore, an objective of the present invention is to provide a programmable gain amplifier with a bandwidth kept constant under variable gains.

The present invention relates to a programmable gain amplifier, which includes an operational amplifier coupled thereto a plurality of resistors to perform a feedback control, thereby rendering a closed-loop gain $$A_f(s) = \frac{A(s)}{1 + A(s) \cdot \beta},$$

where β is a feedback factor and A(s) is an open-loop gain of the operational amplifier; wherein the operational amplifier includes a first-stage amplifying circuit, a second-stage amplifying circuit, and a compensating capacitor coupled to an output end of the first-stage amplifying circuit and having an equivalent capacitance variable to adjust a dominant-pole frequency of the open-loop gain of the operational amplifier.

The present invention also relates to an operational amplifier with an adjustable pole frequency, which includes a first-stage amplifying circuit having a positive input end, a negative input end and a first-stage output end; a second-stage amplifying circuit having a second-stage input end and a second-stage output end; and a compensating capacitor coupled to an output end of the first-stage amplifying circuit and having an equivalent capacitance variable to adjust a dominant-pole frequency of an open-loop gain of the operational amplifier.

The present invention further relates to a method for dynamically compensating a programmable gain amplifier at a target bandwidth, wherein the programmable gain amplifier includes an operational amplifier. The method includes steps of: realizing an open-loop gain A(s) of the operational amplifier according to a capacitance of a variable compensating capacitor which is coupled to an output end of a first-stage amplifying circuit of the operational amplifier; determining a first dominant-pole frequency and a first bandwidth according to the open-loop gain A(s) and a feedback factor β where 0<β<1; decreasing the capacitance of the variable compensating capacitor tuning high the first dominant-pole frequency when the target bandwidth is larger than the first bandwidth; and increasing the capacitance of the variable compensating capacitor for tuning low the first dominant-pole frequency when the target bandwidth is smaller than the first bandwidth.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
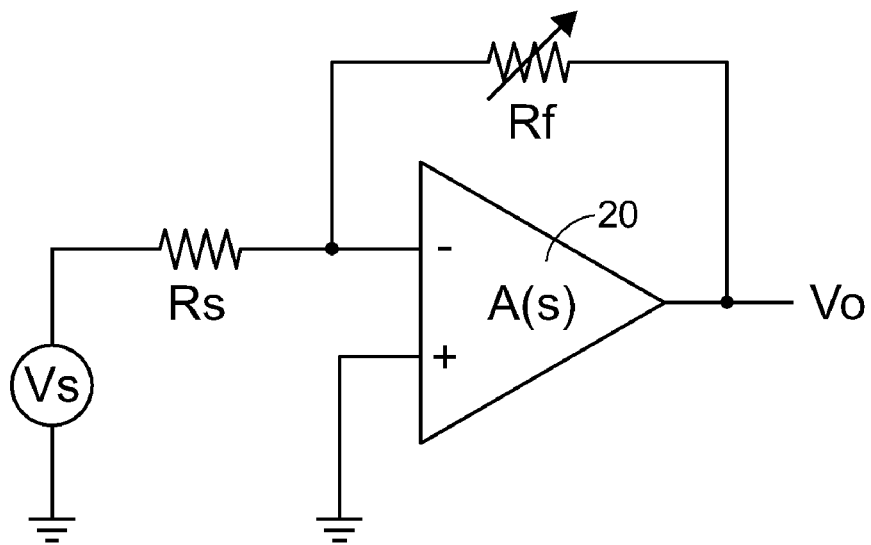
FIG. 1 shows a conventional programmable gain amplifier.
Figure 2:
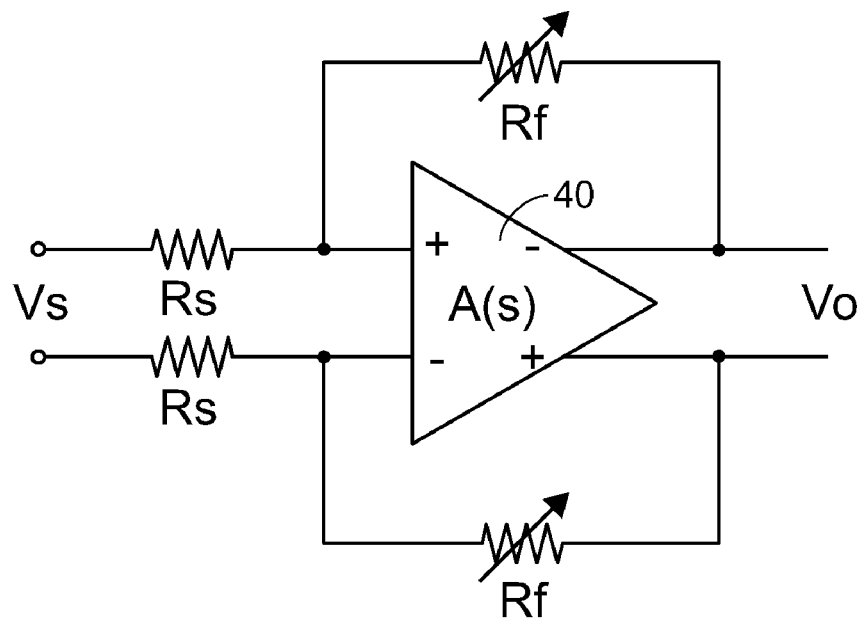
FIG. 2 shows another conventional programmable gain amplifier.
Figure 3:
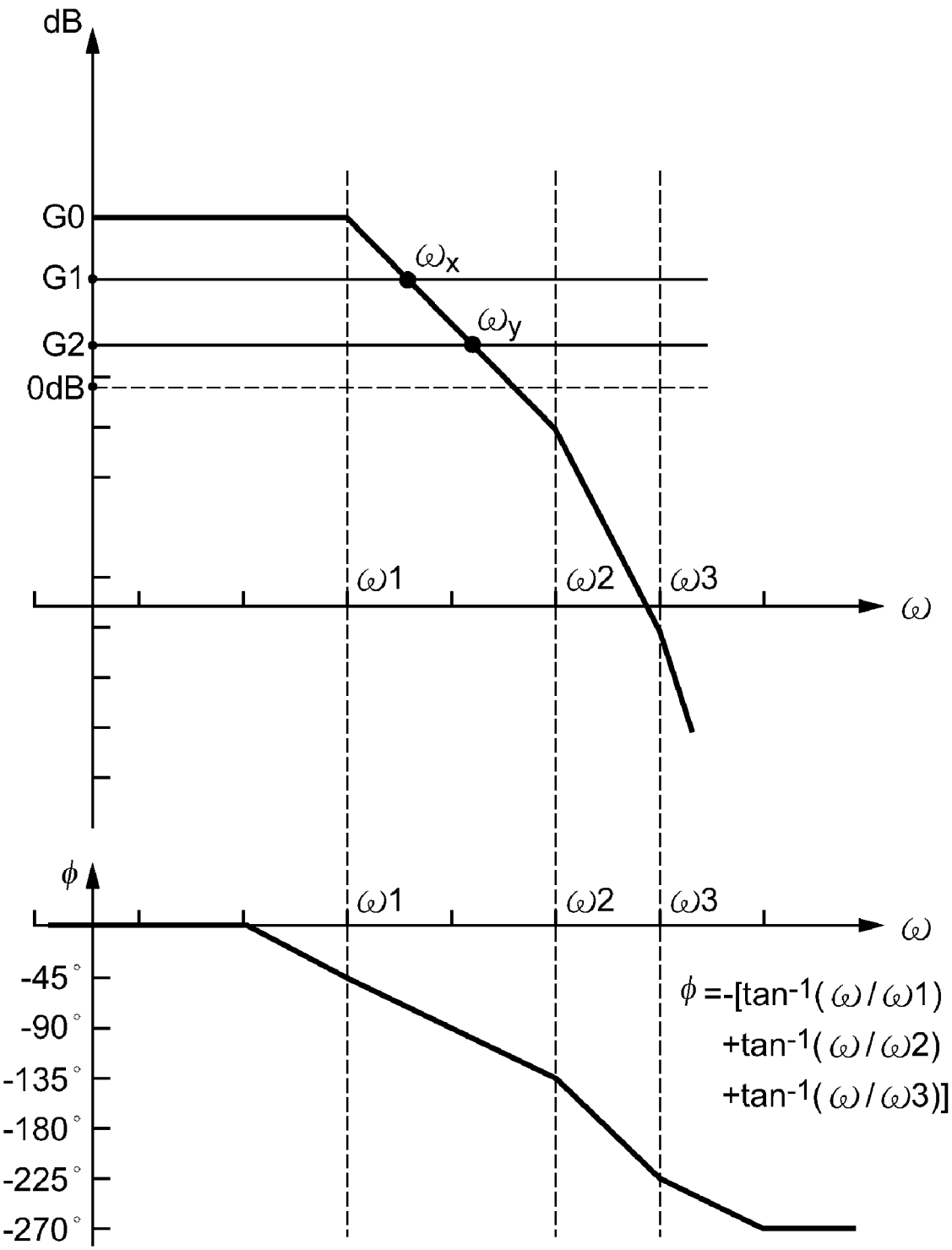
FIG. 3 is a Bode plot of a conventional operational amplifier.
Figure 4:
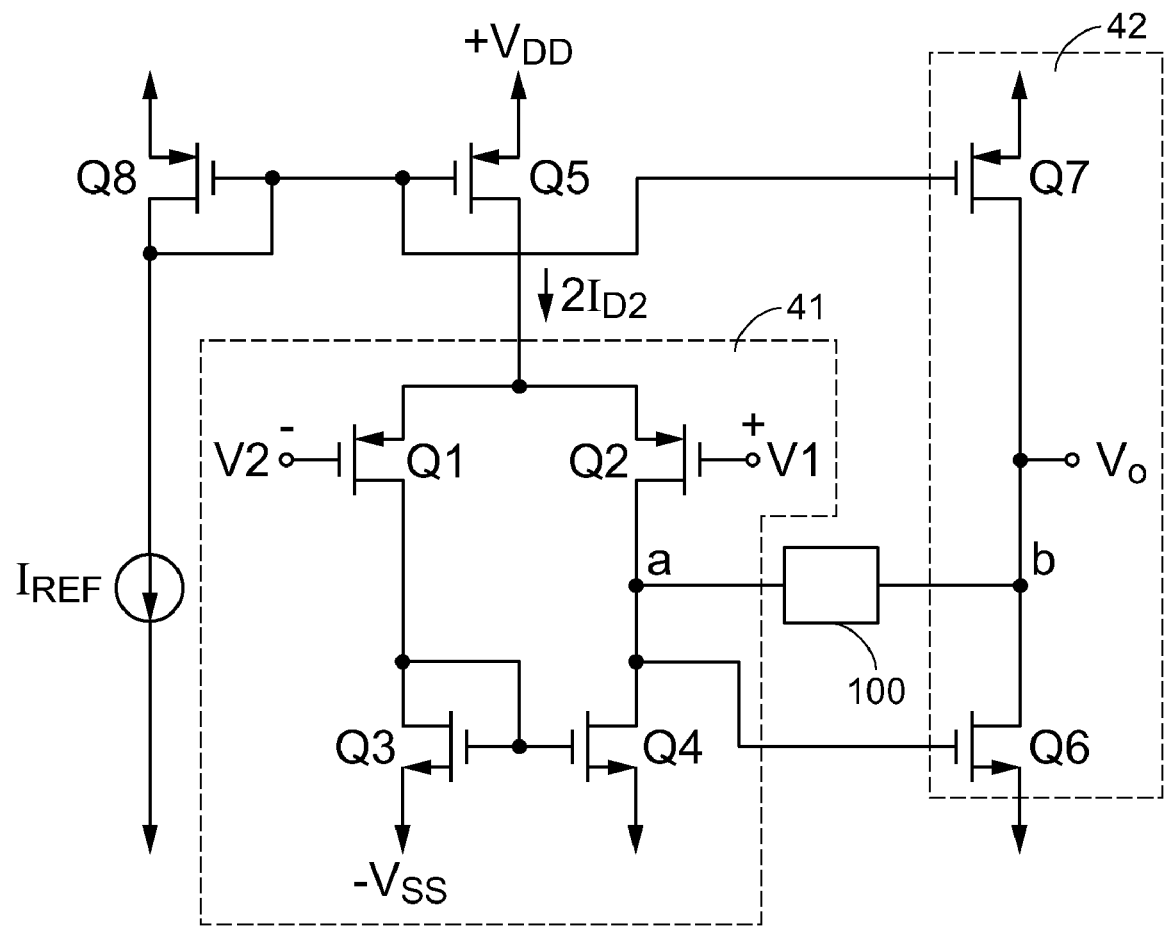
FIG. 4 is a schematic circuit diagram showing an embodiment of an operational amplifier according to the present invention.

Please refer to FIG. 4 which is a circuit diagram showing an operational amplifier with a two-stage complementary metal-oxide semiconductor (CMOS) structure according to an embodiment of the present invention. The operational amplifier includes a first-stage amplifying circuit 41 and a second-stage amplifying circuit 42. Transistors Q8 and Q5 constitute a current mirror for providing a bias current for the first-stage amplifying circuit 41. On the other hand, the transistors Q8 and Q7, which constitute another current mirror, provide a bias current for the second-stage amplifying circuit 42. The first-stage amplifying circuit 41 includes a differential pair of transistors Q1 and Q2 and an active load of transistors Q3 and Q4, wherein the transistors Q3 and Q4 constitute a current mirror. The second-stage amplifying circuit 42 includes a common source amplifier of the transistor Q6 and an active load of the transistor Q7. The output end (node a) of the first-stage amplifying circuit 41 is coupled to the input end (gate of the transistor Q6) of the second-stage amplifying circuit 42. Furthermore, the transistors Q1 and Q2 serve as two input ends of the operational amplifier, and the drain of the transistor Q6 (node b) serves as the output end of the second state amplifying circuit as well as the output terminal Vo of the operational amplifier. For stabilizing the frequency response of the operational amplifier, a feedback capacitance 100 is coupled between the output end of the first stage amplifying circuit and the output end of the second stage amplifying circuit.

According to the present invention, the feedback capacitance 100 is implemented with a variable compensating capacitor. The operating principle of an operational amplifier with a variable compensating capacitance is described with reference to FIG. 5.

Figure 5:
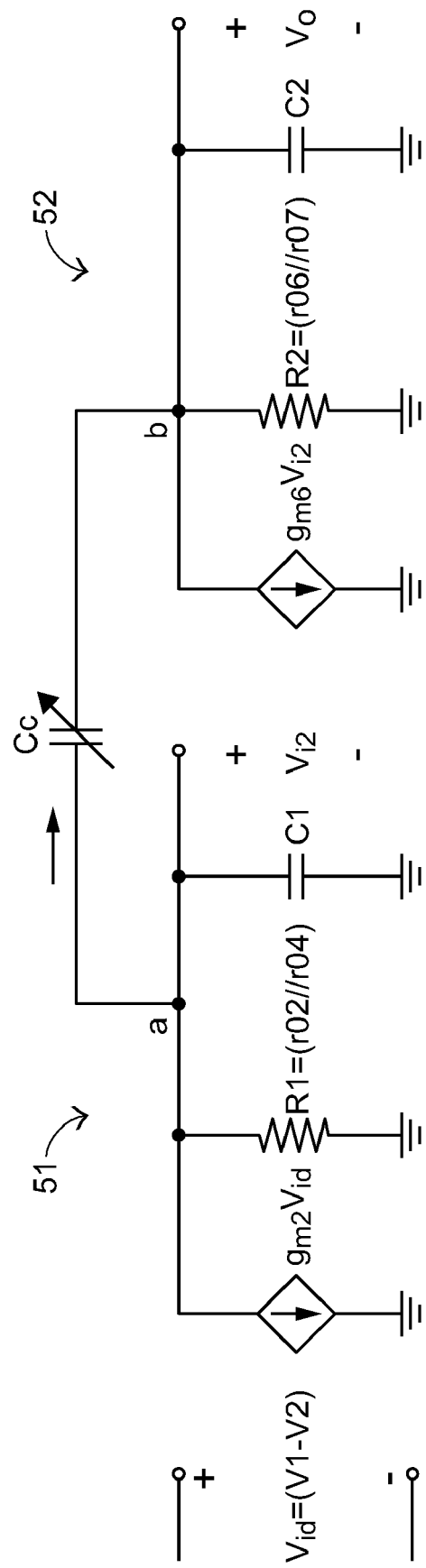
FIG. 5 is a small signal model for a two-stage operational amplifier in FIG. 4.

FIG. 5 illustrates a small signal model of the two-stage CMOS operational amplifier in FIG. 4. The first-stage amplifying circuit 51 includes an input terminal for a differential signal $V_{id}$, and a first transconductance amplifier $g_{m2}V_{id}$, a first resistor R1 and a first capacitor C1 coupled between node a and ground in parallel. The first transconductance amplifier $g_{m2}V_{id}$ serves a current source for providing a current $V_{id}*g_{m2}$, where $g_{m2}$ is the transconductance of the transistor Q2 and equal to $$\sqrt{2(\mu_p C_{ox})\left(\frac{W_2}{L_2}\right)I_{D2}}$$

where $\mu_p$ is hole mobility, $C_{ox}$ is oxide capacitance, $$\left(\frac{W_2}{L_2}\right)$$

is the aspect ratio of the transistor Q2 and $I_{D2}$ is drain direct-current of the transistor Q2. The first resistor R1 has a resistance equal to the equivalent output resistance $r_{o2}//r_{o4}$ of the parallel connected transistors Q2 and Q4. The output resistance of the transistor Q2 is expressed as $$r_{o2} = \frac{|V_A|}{I_{D2}},$$

where $|V_A|$ is realized according to a MOSFET parameter $\lambda$, i.e. $V_A=1/\lambda$. Likewise, the output resistance of the transistor Q4 is expressed $$r_{o4} = \frac{|V_A|}{I_{D2}}.$$

The first capacitor C1 has a capacitance equivalent to the total capacitance at the interface between the first-stage circuit 51 and the second-stage circuit 52. Node a is an output end of the first-stage amplifying circuit 51, and the output voltage of the first-stage amplifying circuit 51 is the voltage signal $V_{i2}$ between node a and the ground.

On the other hand, the second-stage amplifying circuit 52 includes a second transconductance amplifier $g_{m6}V_{i2}$, a second resistor R2 and a second capacitor C2 coupled between node a and the ground in parallel. The second transconductance amplifier $g_{m6}V_{i2}$ generates a current source with a current intensity of $V_{i2}*g_{m6}$, where $V_{i2}$ is the voltage of the output signal from the first-stage amplifying circuit and $g_{m6}$ is the transconductance of the transistor Q6 and can be derived in a manner similar to $g_{m2}$. The second resistor R2 has a resistance equal to the equivalent output resistance $r_{o6}//r_{o7}$ of the parallel connected transistors Q6 and Q7, and the output resistances $r_{o6}$ and $r_{o7}$ can be derived in a manner similar to $r_{o2}$ and $r_{o4}$. The second capacitor C2 has a capacitance equivalent to the capacitance at the output terminal of the operational amplifier. Node b serves as both the output end of the second-stage amplifying circuit and the output terminal of the operational amplifier.

Furthermore, a feedback capacitor Cc is coupled between the output end a of the first-stage amplifying circuit and the output end b of the second-stage amplifying circuit.

Based on the small signal model of FIG. 5, it is realized that the open-loop gain A(s) of the operational amplifier has at least two pole frequencies, i.e.

$$\omega_{p1} = \frac{1}{g_{m6}R_2C_cR_1} \text{ and } \omega_{p2} = \frac{g_{m6}C_c}{C_1C_2 + C_c(C_1+C_2)},$$

where $\omega_{p1}$ is much less than $\omega_{p2}$ and realized as a dominant-pole frequency. Accordingly, by adjusting the feedback capacitance Cc, the dominant-pole frequency $\omega_{p1}$ of the operational amplifier can be changed so as to change the bandwidth of the operational amplifier. In more detail, the increase of the feedback capacitance Cc results in the reduction of the dominant-pole frequency $\omega_{p1}$ as well as the bandwidth of the operational amplifier. On the contrary, the decrease of the feedback capacitance Cc results in the increase of the dominant-pole frequency $\omega_{p1}$ as well as the bandwidth of the operational amplifier. Thus the bandwidth of the operational amplifier can be dynamically adjusted by manipulating the variable compensating capacitance Cc, and the bandwidth of a programmable gain amplifier including the operational amplifier can be kept substantially constant under variable gains accordingly.

In brief, by providing and adjusting the variable feedback capacitance 100 between the output end a of the first-stage amplifying circuit and the output end b of the second-stage amplifying circuit, the pole frequencies of the open-loop gain A(s) of the operational amplifier are variable. With the introduction of the feedback factor $\beta$, similar results can be obtained for a programmable gain amplifier. Consequently, the bandwidth of the programmable gain amplifier can be kept substantially constant under variable gains.

Figure 6:
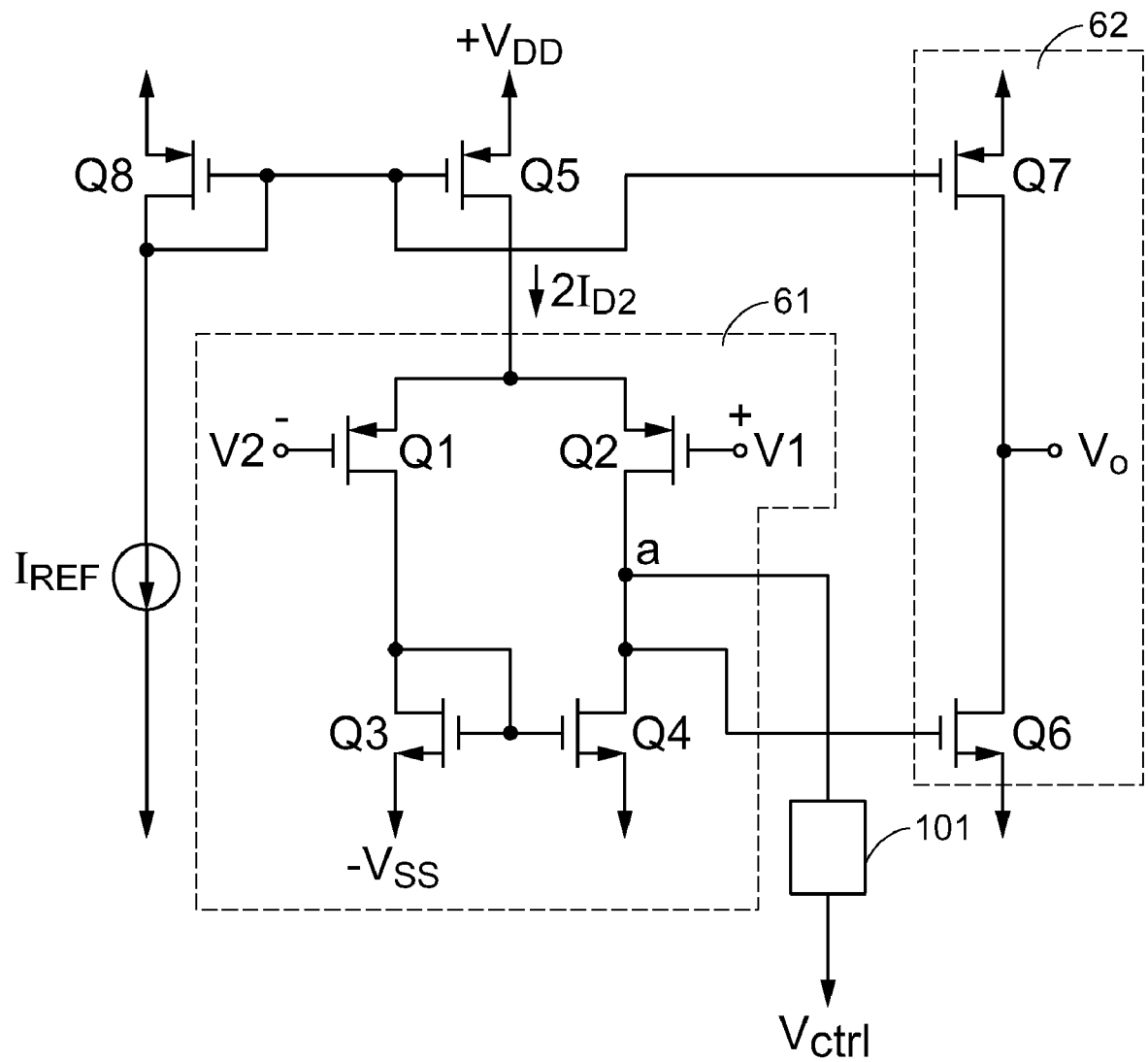
FIG. 6 is a schematic circuit diagram showing another embodiment of an operational amplifier according to the present invention.

FIG. 6 illustrates another embodiment of operational amplifier with adjustable pole frequencies according to the present invention, wherein the operational amplifier is a single-ended compensated operational amplifier. Similar to the operational amplifier of FIG. 4, a variable compensating capacitor 101 is provided but coupled to the output end a of a first-stage amplifying circuit 61. The equivalent capacitance provided by the variable compensating capacitor 101 can be adjusted with a control voltage $V_{ctrl}$, and the pole frequencies of the open-loop gain A(s) of the operational amplifier can be adjusted accordingly. An optimum adjusting level of the dominant-pole frequency can be determined by way of simulation during circuit design.

Figure 7:
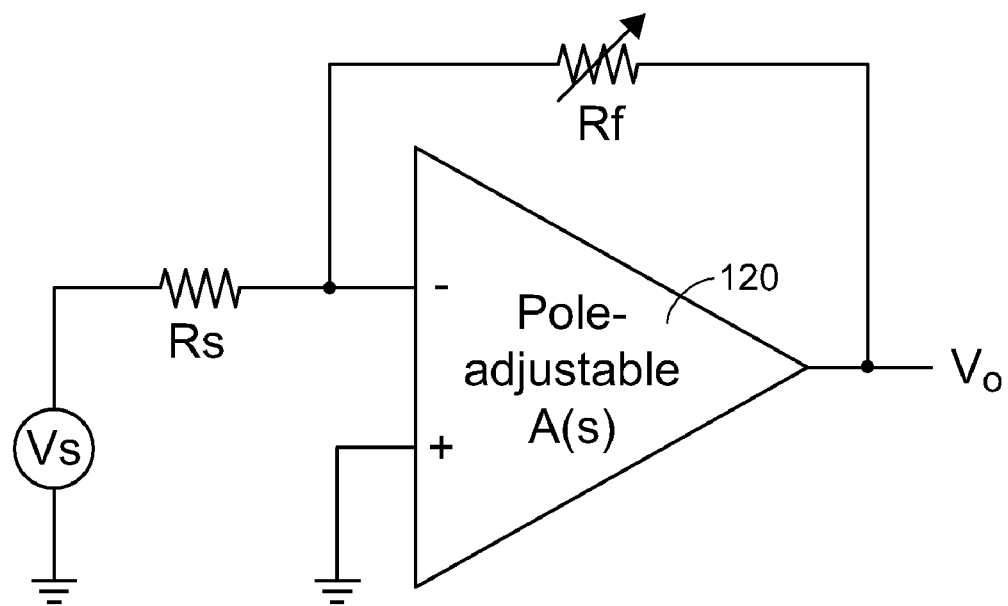
FIG. 7 shows a programmable gain amplifier according to an embodiment of the present invention, wherein a pole frequency of the operational amplifier is adjustable.
Figure 9:
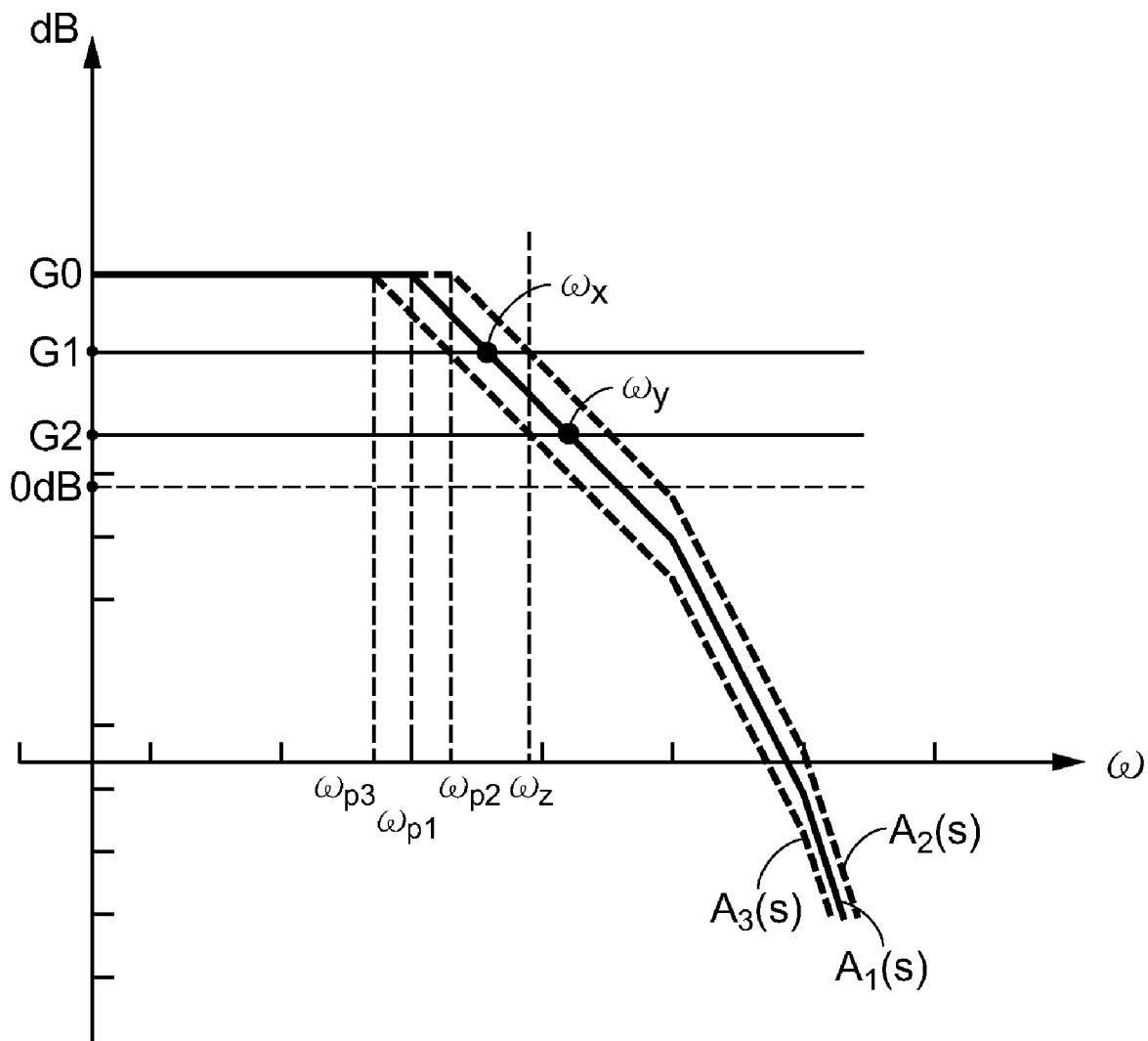
FIG. 9 is a Bode plot showing how the bandwidth of a programmable gain amplifier is dynamically adjusted.

Please refer to FIG. 7 which is a circuit diagram of a programmable gain amplifier according to an embodiment of the present invention. The programmable gain amplifier includes an operational amplifier 120, a feedback resistor Rf and a resistor Rs. FIG. 9 exemplifies a Bode plot of the operational amplifier 120, wherein the open-loop gain A(s) is shown as $A_1(s)$ when the variable compensating frequency is $C_{c1}$. For the open-loop gain $A_1(s)$, the dominant-pole frequency is $\omega_{p1}$. If the bandwidth of the programmable gain amplifier is to be kept constant at another bandwidth, e.g. $\omega_z$, the dominant-pole frequency should be selectively shifted to a proper value from $\omega_{p1}$. For example, when the feedback factor $\beta$ is equal to $\beta_1(0<\beta_2<\beta_1<1)$ and thus the gain is expressed in the Bode plot as the relatively high G1, the dominant-pole frequency should be shifted from $\omega_{p1}$ to $\omega_{p2}$, i.e. the open-loop gain $A_2(s)$ applies, in order to result in a bandwidth $\omega_z$. The change from the open-loop gain $A_1(s)$ to $A_2(s)$ can be achieved by reducing the variable compensating capacitance from $C_{c1}$ to $C_{c2}$. On the other hand, when the feedback factor $\beta$ is equal to $\beta_2$ and thus the gain is expressed in the Bode plot as the relatively low G2, the dominant-pole frequency should be shifted from $\omega_{p1}$ to $\omega_{p3}$, i.e. the open-loop gain $A_3(s)$ applies, in order to result in the same bandwidth $\omega_z$. The change from the open-loop gain $A_1(s)$ to $A_3(s)$ can be achieved by increasing the variable compensating capacitance from $C_{c1}$ to $C_{c3}$. In this way, the bandwidth of the programmable gain amplifier can be kept at a substantially constant level.

Figure 8:
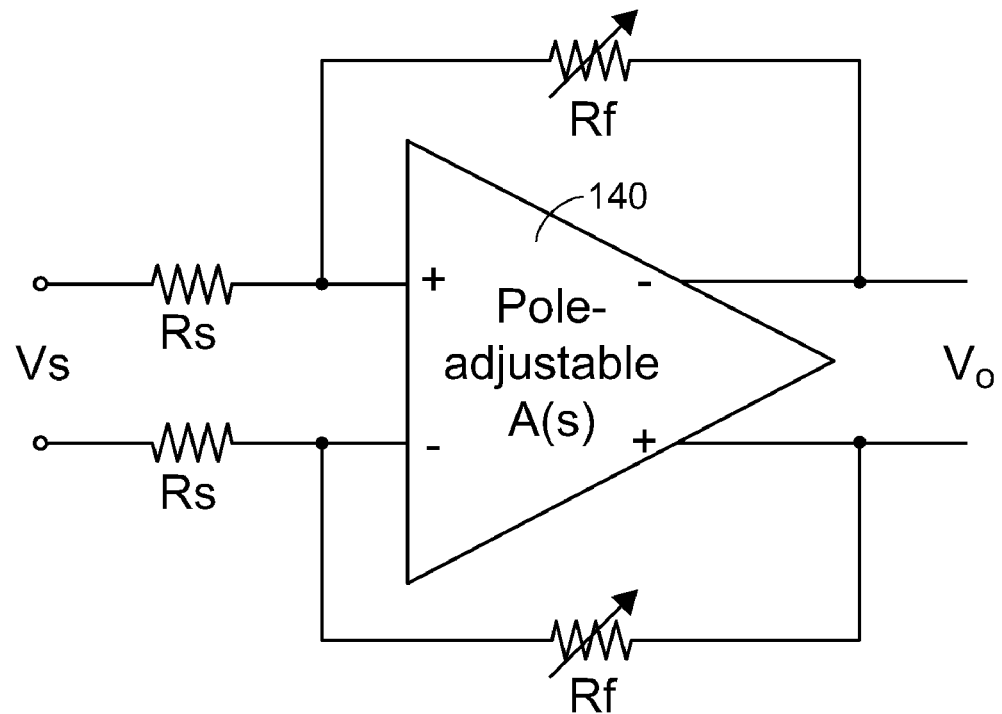
FIG. 8 shows a programmable gain amplifier according to an embodiment of the present invention, wherein a pole frequency of the operational amplifier is adjustable.

The above feature can also be applied to a differential programmable gain amplifier according to another embodiment of the present invention. Referring to FIG. 8, the differential programmable gain amplifier includes a differential operational amplifier 140, two resistors Rs with equal resistance and two feedback resistors Rf with equal resistance. By selectively adjusting the variable compensating capacitance, a proper dominant-pole frequency can be located so as to result in a desired bandwidth. Refer again to FIG. 9. The decrease of the variable compensating capacitance from $C_{c1}$ to $C_{c2}$ results in the dominant-pole shift from $\omega_{p1}$ to $\omega_{p2}$ while resulting in the bandwidth shift from $\omega_x$ to $\omega_z$. On the other hand, the increase of the variable compensating capacitance from $C_{c1}$ to $C_{c3}$ results in the dominant-pole shift from $\omega_{p1}$ to $\omega_{p3}$ while resulting in the bandwidth shift from $\omega_y$ to $\omega_z$. Accordingly, substantially the same bandwidth shift $\omega_z$ can be achieved.

Hereinafter, how the variable compensating capacitor is decreased or increased will be described.

Figure 10A:
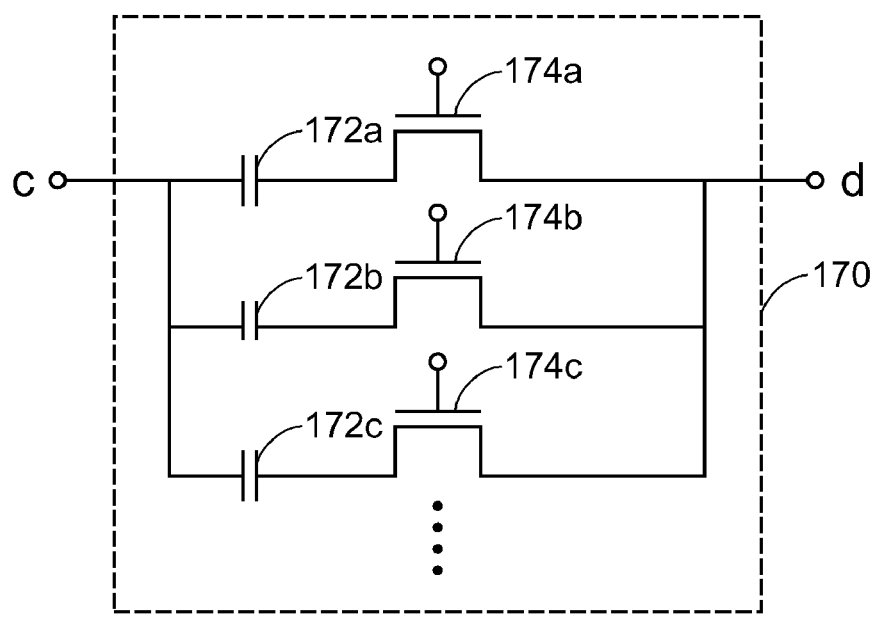
FIGS. 10A, 10B and 10C show variable compensating capacitors.

An embodiment of the variable compensating capacitor 100 used in the operational amplifier of FIG. 4 is illustrated hereinafter with reference to FIG. 10A. The variable compensating capacitor includes a switching capacitor bank 170 between Node c and Node d. The switching capacitor bank 170 includes a plurality of capacitance-controlled paths, each of which includes a capacitor (172a, 172b, 172c, . . . ) and a switching transistor (174a, 174b, 174c, . . . ) interconnected in series. Via the gate electrodes of respective switching transistors 174a, 174b and 174c, the conduction of the paths between Node c and Node d can be independently and selectively controlled. A connected path will contribute to the increase of the equivalent capacitance of the variable compensating capacitor 100. On the contrary, the equivalent capacitance of the variable compensating capacitor 100 can be reduced by disconnecting one or more of the paths.

Figure 10B:
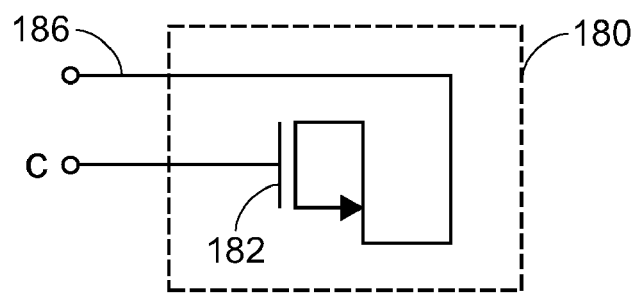

An embodiment of the variable compensating capacitor 101 used in the operational amplifier of FIG. 6 is illustrated hereinafter with reference to FIG. 10B. The variable compensating capacitor 101 is implemented with a varactor unit 180. The varactor unit 180 includes a field effect transistor (FET) 182 having interconnected drain and source electrodes, and the drain electrode is further connected to a voltage-controlled end 186. With the change of the input voltage at the voltage-controlled end 186, the voltage difference between the drain and gate electrodes changes so as to change the capacitance of the FET 182. Accordingly, the equivalent capacitance of the variable compensating capacitor 101 can be selectively increased or decreased.

Figure 10C:
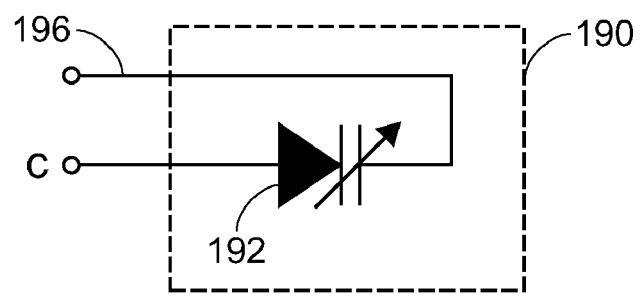

Another embodiment of the variable compensating capacitor 101 is shown in FIG. 10C. The variable compensating capacitor is implemented with a varactor unit 190 including a varicap diode 192. The anode of the varicap diode 192 is coupled to Node c, and its cathode is coupled to a voltage-controlled end 196. When the input voltage at the voltage-controlled end 196 changes, the voltage difference between the anode and cathode of the varicap diode 192 changes accordingly, thereby varying the equivalent capacitance of the variable compensating capacitor 101.

Figure 11:
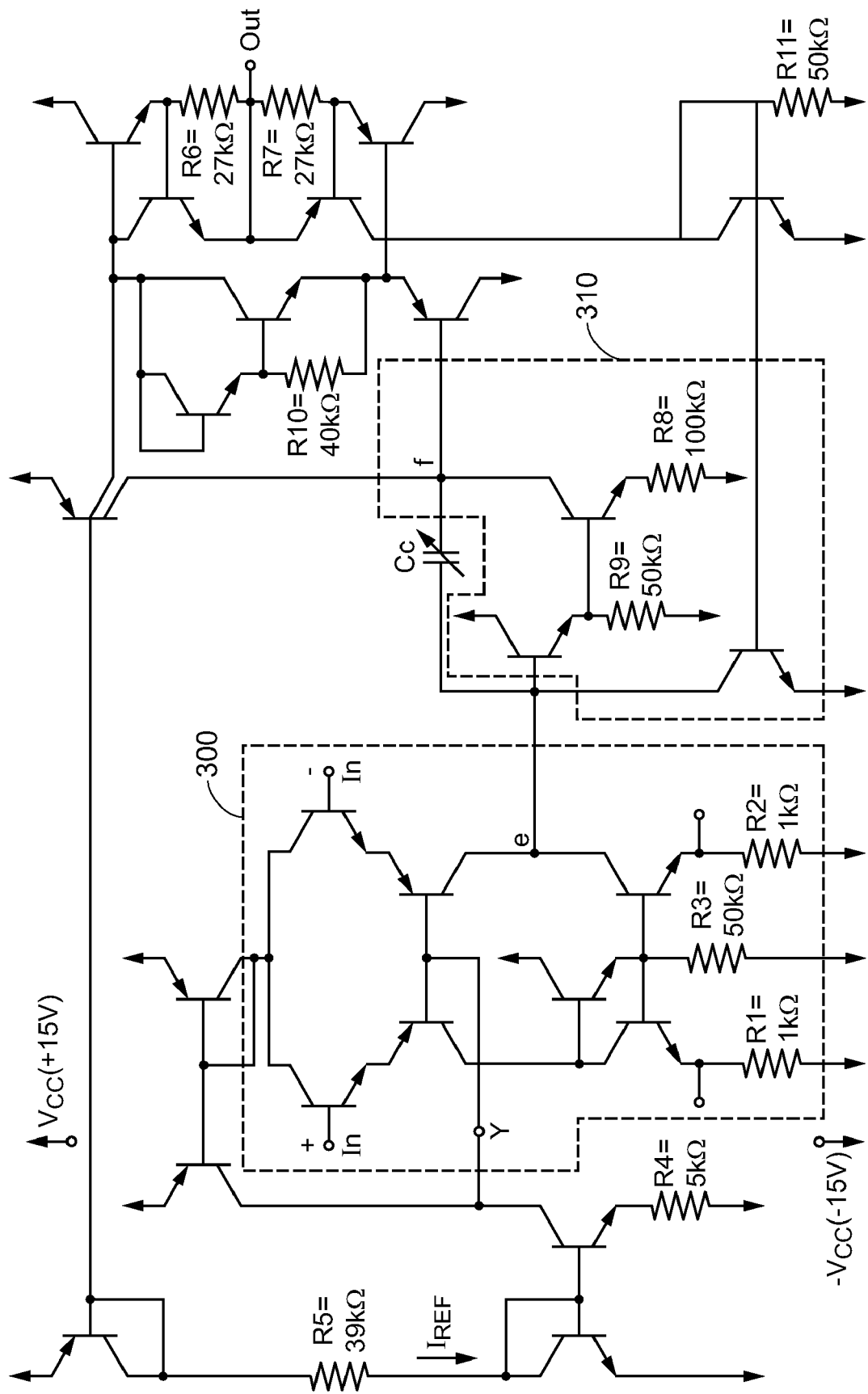
FIG. 11 is a schematic circuit diagram showing a further embodiment of an operational amplifier according to the present invention.

It is to be noted that the use of two-stage CMOS transistors in an operational amplifier is just one example, and other proper amplifying circuit, for example using bipolar junction transistor (BJT), can also be used to achieve the similar objective of the present invention. FIG. 11 illustrates an embodiment of an operational amplifier with a two-stage BJT structure. The operational amplifier includes a first-stage amplifying circuit 300 and a second-stage amplifying circuit 310. A variable compensating capacitance Cc is coupled between the output end e of the first-stage amplifying circuit 300 and the output end f of second-stage amplifying circuit 310, which can be implemented with the capacitor of FIGS. 10A, 10B, 10C or any other suitable capacitor. Likewise, by way of varying the variable compensating capacitance Cc, the bandwidth of the operational amplifier can be adjusted. Furthermore, by dynamically adjusting the pole frequency of the operational amplifier based on the feedback factor $\beta$, the bandwidth of a programmable gain amplifier performing negative feedback with multiple resistors can be kept substantially constant under various gains.

Moreover, a method for dynamically compensating a programmable gain amplifier at a target bandwidth is disclosed according to one embodiment of the present invention. The programmable gain amplifier including an operational amplifier. The method includes steps of: realizing an open-loop gain A(s) of the operational amplifier according to a capacitance of a variable compensating capacitor which is coupled to an output end of a first-stage amplifying circuit of the operational amplifier; determining a first dominant-pole frequency and a first bandwidth according to the open-loop gain A(s) and a feedback factor $\beta$ where $0<\beta<1$; decreasing the capacitance of the variable compensating capacitor tuning high the first dominant-pole frequency when the target bandwidth is larger than the first bandwidth; and increasing the capacitance of the variable compensating capacitor for tuning low the first dominant-pole frequency when the target bandwidth is smaller than the first bandwidth.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A programmable gain amplifier, comprising:
an operational amplifier coupled thereto a plurality of resistors to perform a feedback control, thereby rendering a closed-loop gain $$A_f(s) = \frac{A(s)}{1+A(s)\cdot\beta},$$

wherein $\beta$ is a feedback factor determined by the resistance of the resistors and A(s) is an open-loop gain of the operational amplifier;
wherein the operational amplifier includes a first-stage amplifying circuit, a second-stage amplifying circuit, and a compensating capacitor coupled to an output end of the first-stage amplifying circuit and having an equivalent capacitance variable to adjust a dominant-pole frequency of the open-loop gain of the operational amplifier.

2. The programmable gain amplifier according to claim 1 wherein the plurality of resistors include a first resistor and a feedback resistor, and the operational amplifier has a positive input terminal grounded, a negative input terminal for receiving an input signal passing through the first resistor, and an output terminal coupled to the negative input terminal via the feedback resistor.

3. The programmable gain amplifier according to claim 1 wherein the equivalent capacitance of the compensating capacitor is adjusted according to the feedback factor for adjusting a bandwidth of the programmable gain amplifier.

4. The programmable gain amplifier according to claim 1 wherein the compensating capacitor is a switching capacitor bank.

5. The programmable gain amplifier according to claim 4 wherein the switching capacitor bank is coupled to an output end of the first-stage amplifying circuit and an output end of the second-stage amplifying circuit.

6. The programmable gain amplifier according to claim 4 wherein the switching capacitor bank includes a plurality of capacitance-controlled paths, each of which includes a capacitor and a switching transistor and optionally conducted with control via a control end of the switching transistor.

7. The programmable gain amplifier according to claim 1 wherein the compensating capacitor is a varactor unit.

8. The programmable gain amplifier according to claim 7 wherein the varactor unit is a field effect transistor having a gate electrode coupled to the output end of the first-stage amplifying circuit, and a drain electrode and a source electrode connected to each other and coupled to a voltage control end.

9. The programmable gain amplifier according to claim 1 wherein the varactor unit is a varactor diode.

10. The programmable gain amplifier according to claim 9 wherein the varactor diode has an anode coupled to the output end of the first-stage amplifying circuit and a cathode coupled to a voltage control end.

11. The programmable gain amplifier according to claim 1 wherein the plurality of resistors include two second resistors with equal resistance and two feedback resistors with equal resistance, and the operational amplifier has a positive input terminal for receiving an input signal passing through one of the second transistors, a negative input terminal for receiving the input signal passing through the other of the second resistors, a negative output terminal coupled to the positive input terminal via one of the feedback resistors, and a positive output terminal coupled to the negative input terminal via the other of the feedback resistors.

12. An operational amplifier with an adjustable pole frequency, comprising:
 a first-stage amplifying circuit having a positive input end, a negative input end and a first-stage output end;
 a second-stage amplifying circuit having a second-stage input end and a second-stage output end; and
 a compensating capacitor coupled to an output end of the first-stage amplifying circuit and having an equivalent capacitance variable to adjust a dominant-pole frequency of an open-loop gain of the operational amplifier.

13. The operational amplifier according to claim 12 wherein the compensating capacitor is a switching capacitor bank.

14. The operational amplifier according to claim 13 wherein the switching capacitor bank is coupled between the first-stage output end and the second-stage output end.

15. The operational amplifier according to claim 12 wherein the compensating capacitor is a field effect transistor having a gate electrode coupled to the first-stage output end, and a drain electrode and a source electrode connected to each other and coupled to a voltage control end.

16. The operational amplifier according to claim 12 wherein the varactor unit is a varactor diode.

17. The operational amplifier according to claim 12 being a differential operational amplifier.

18. A method for dynamically compensating a programmable gain amplifier at a target bandwidth, the programmable gain amplifier including an operational amplifier, the method comprising steps of:
 realizing an open-loop gain A(s) of the operational amplifier with a capacitance of a variable compensating capacitor which is coupled to an output end of a first-stage amplifying circuit of the operational amplifier;
 determining a first dominant-pole frequency and a first bandwidth according to the open-loop gain A(s) and a feedback factor $\beta$ where $0<\beta<1$;
 decreasing the capacitance of the variable compensating capacitor for tuning high the first dominant-pole frequency when the target bandwidth is larger than the first bandwidth; and
 increasing the capacitance of the variable compensating capacitor for tuning low the first dominant-pole frequency when the target bandwidth is smaller than the first bandwidth.

19. The method according to claim 18 wherein when the feedback factor $\beta$ is equal to $\beta_1$ where $0<\beta_1<1$, the target bandwidth is achieved with a first capacitance $C_1$ of the variable compensating capacitor, and when the feedback factor $\beta$ is equal to $\beta_2$ where $0<\beta_2<\beta_1<1$, the target bandwidth is achieved with a second capacitance $C_2$ of the variable compensating capacitor, wherein $C_1$ is smaller than $C_2$.

* * * * *